(12) United States Patent
Takeuchi et al.

(10) Patent No.: US 7,371,991 B2
(45) Date of Patent: May 13, 2008

(54) IRON BEAM IRRADIATION DEVICE AND INSULATING SPACER FOR THE DEVICE

(75) Inventors: Etsuo Takeuchi, Tokyo (JP); Akira Hatakeyama, Tokyo (JP)

(73) Assignee: TDK Corporation, Tokyo (JP)

( * ) Notice: Subject to any disclaimer, the term of this patent is extended or adjusted under 35 U.S.C. 154(b) by 455 days.

(21) Appl. No.: 11/205,073

(22) Filed: Aug. 17, 2005

(65) Prior Publication Data
US 2006/0060795 A1 Mar. 23, 2006

(30) Foreign Application Priority Data
Sep. 9, 2004 (JP) ............... 2004-262327

(51) Int. Cl.
*B23K 10/00* (2006.01)
(52) U.S. Cl. .................. 219/121.36; 219/121.48; 219/121.43; 315/111.41; 315/111.81; 250/423 R
(58) Field of Classification Search .......... 219/121.43, 219/121.36, 121.48, 121.4, 121.41, 121.52; 313/231.31; 315/111.21, 111.81, 111.41; 250/423 R
See application file for complete search history.

(56) References Cited
U.S. PATENT DOCUMENTS
4,987,346 A * 1/1991 Katzschner et al. .... 315/111.41

5,198,718 A * 3/1993 Davis et al. ............. 313/359.1
6,346,768 B1 * 2/2002 Proudfoot ................ 313/359.1
2006/0192132 A1 * 8/2006 Kanarov et al. ........ 250/396 R

FOREIGN PATENT DOCUMENTS

JP 2000-113849 4/2000
JP 2000-301353 10/2000

* cited by examiner

*Primary Examiner*—Mark Paschall
(74) *Attorney, Agent, or Firm*—Oblon, Spivak, McClelland, Maier & Neustadt, P.C.

(57) ABSTRACT

Disclosed is a structure aimed to reduce the frequency of replacement of an insulating spacer arranged between grids of an ion beam irradiation device. More specifically, disclosed is a so-called insulating spacer arranged in order to maintain insulation between the grids, the insulating spacer having an annular groove in a portion composed of an annular, substantially plane portion opposed to a grid and a cylindrical portion being raised from the central portion of the annular, substantially plane portion and abutting the grid, with the annular groove being perpendicular to the plane and separating the peripheral portion of the annular portion from the cylindrical portion.

6 Claims, 3 Drawing Sheets

IRON BEAM IRRADIATION DEVICE AND INSULATING SPACER FOR THE DEVICE

BACKGROUND OF THE INVENTION

1. Field of the Invention

The present invention relates to an iron beam irradiation device which draws out in a predetermined direction an ion beam from a plasma generated in a chamber through a grid to which a predetermined voltage is imparted, and applies the ion beam thus drawn out. More specifically, the present invention relates to a milling device which performs processing, for example, on the surface of a workpiece by using an ion beam drawn out, an ion implantation device which implants ions in a film, an ion beam film forming device which performs film formation, etc., and to an insulating member used as a spacer when fixing a grid in such devices.

2. Related Background Art

For example, a milling device using an ion beam uses a plasma generated in a chamber as an ion source, draws out ions from the ion source by using a plurality of grids to which a DC voltage is applied, and accelerates the ions in a predetermined direction, so as to perform milling by using the accelerated ions. Usually, the individual grids have holes for allowing passage of ions, and different DC voltages are applied thereto so as to optimize the ion energy drawn out and the distribution thereof. Here, the term milling refers to a process in which accelerated ions are caused to impinge upon the surface of a workpiece to generate a sputtering phenomenon to perform fine processing on the surface (see JP 2000-113849 A).

Between these grids, there is usually arranged an insulating spacer consisting of an insulator in order to prevent them from coming into contact with each other and to maintain a fixed distance between the grids. A specific example of the construction of a conventionally used insulating spacer will be described with reference to a drawing. FIG. 5 is a schematic sectional view of an insulating spacer for fixing three grids. An insulating spacer 20 for fixing grids 15, 16, and 17 is composed of a first insulating member 21, a second insulating member 25, an insulating cap 27, a mounting screw 29, and a nut 31.

The first insulating member 21 has a cylindrical large diameter portion 21a with a threaded outer periphery, a grid fixing portion 21b which is connected with the large diameter portion 21a and which has a tapered surface constituting a part of a cone whose outer diameter increases as it extends away from the large diameter portion 21a, and a small diameter portion 21c which is connected with the grid fixing portion 21b and whose outer diameter is smaller than that of the large diameter portion 21a. Further, the large diameter portion 21a, the grid fixing portion 21b, and the small diameter portion 21c are coaxial and formed in continuation, with a through-hole 21d being formed at the axial center thereof. Further, at the large diameter portion 21a side opening of the through-hole 21d, there is formed an enlarged-diameter portion 21e with an increased inner diameter. At the end of the small diameter portion 21c, there is formed a plane substantially perpendicular to the axial center, with and abutting the grid 17.

Formed in the grid 17 is a hole 17a through which the mounting screw 29 can be passed. When the mounting screw 29 is inserted into the through-hole 21d, the head portion of the mounting screw 29 is engaged with a step portion existing between the enlarged-diameter portion 21e and the through-hole 21d. The end portion of the screw portion of the mounting screw 29 in the inserted state protrudes from the hole 17a, and this protruding portion is threadedly engaged with the nut 31. Through the threaded-engagement operation, the grid 17 is held between the nut 31 and the end surface of the small diameter portion 21c, thus determining the positional relationship between the first insulating member 21 and the grid 17.

Formed in the grid 16 is a hole 16a whose diameter varies in correspondence with the tapered surface of the grid fixing portion 21b. The tapered surface of the hole 16a abuts the tapered surface of the grid fixing portion 21b. As a result, the positional relationship between the grid 16 and the first insulating member 21 is determined. The distance between the grid 16 and the grid 17 is determined by the outer periphery of the first insulating member 21 and the second, annular insulating member 25 arranged between these grids. The insulating cap 27 has a cylindrical configuration with one end closed and has at the open end an outwardly protruding flange portion 27a. A thread is formed inside the cylinder, and through threaded engagement of the thread in the outer periphery of the large diameter portion 21a with the above-mentioned thread, the insulating cap 27 is fixed with respect to the first insulating member 21.

The grid 15 is held and fixed between the second insulating member 25 and the flange portion 27a of the insulating cap. That is, by threadedly engaging the insulating cap 27 with the first insulating member 21 for fixation, the grid 16, the second insulating member 25, and the grid 15 are held between the grid fixing portion 21b and the flange portion 27a. As a result, their positional relationship with the first insulating member 21 is determined.

Here, when, for example, ion milling is performed by using an ion beam drawn out, sputtering is effected on the surface of a workpiece with this ion beam. Further, when drawing ions out of the chamber through the grids, not all of the ions accelerated by the grids reach the exterior of the chamber; a part of them may hit the grids, etc. to effect sputtering thereon. The substance thus struck out from the workpiece surface or the grids, etc. by this sputtering will be redeposited in the interior of the device. Regarding the first insulating member 21 shown here, what matters most is the redeposition of a substance on a surface 21f opposed to the grid 17 existing between the grid fixing portion 21b and the small diameter portion 21c, and on the outer peripheral surface of the small diameter portion 21c. FIG. 6 is an enlarged view of a region 22 where such redeposition occurs at high frequency.

When the redeposited substance is conductive, the insulation property of the above-mentioned insulating spacer, for example, deteriorates as the amount of redeposited substance increases, with the result that short-circuiting may finally occur between the grids. To prevent this, it is necessary to perform the operation of removing the redeposit film in a state in which the redeposition on the insulating spacer has progressed to some degree, or replace the insulating spacer by a new one. Thus, when, for example, processing is conducted on the metal film by milling operation, the insulation property abruptly deteriorates due to the redeposition of the metal, so that it is necessary to conduct the short-circuit preventing operation in a considerably short cycle. JP 2000-301353 A discloses a technology using an insulating spacer with a tapered sectional configuration.

SUMMARY OF THE INVENTION

The present invention has been made in view of the above-mentioned problems inherent in the prior art. It is an object of the present invention to provide an insulating spacer that allows a substantial reduction in the replacement frequency thereof, etc. Another object of the present invention is to provide an ion beam irradiation device in which a reduction in device operation time due to the above-mentioned replacement, etc. is suppressed by the use of such insulating spacer.

In order to achieve the above objects, an ion beam irradiation device according to the present invention includes a plasma generation chamber which generates a plasma inside, and a processing chamber connected to the plasma generation chamber, with a plurality of grids with a large number of small holes being arranged between the plasma generation chamber and the processing chamber in order to draw out ions in the plasma. The ion beam irradiation device further includes an insulating spacer fixed to each of the plurality of grids to determine a positional relationship of the grids and to prevent the grids from electrically coming into contact with each other, in which the insulating spacer has a grid support portion supporting one of the grids, and an annular groove in an insulating portion consisting of a grid fixing portion with an annular, substantially plane portion opposed to another of the grids with a predetermined space therebetween and formed in a region different from the grid support portion and a small diameter portion which is a cylindrical portion being raised from a central portion of the annular, substantially plane portion and having an end surface abutting another of the grids, with the annular groove being perpendicular to the plane and separating a peripheral portion of the annular portion and the cylindrical portion from each other.

In the above-mentioned ion beam irradiation device, it is preferable that: the grid fixing portion have a cylindrical accommodation hole at the central portion of the annular, substantially plane portion; and the small diameter portion, which is the cylindrical portion, be formed of a member different from the grid fixing portion and can be accommodated in the accommodation hole to protrude from the accommodation hole by a predetermined length, with the annular groove being formed between an outer peripheral portion of the cylindrical portion and an inner peripheral portion of the accommodation hole.

Furthermore, in order to achieve the above objects, an ion milling device according to the present invention has: the ion beam irradiation device having the features as described above, a processing chamber into which ions drawn out of the ion beam irradiation device is introduced, and a holder arranged in the processing chamber and adapted to hold a workpiece at a position where the ions drawn out are applied.

Moreover, in order to achieve the above objects, there is provided an ion beam irradiation device in which an insulating spacer according to the present invention is composed of a plasma generation chamber which generates a plasma inside, and a processing chamber connected to the plasma generation chamber, with a plurality of grids with a large number of small holes being arranged between the plasma generation chamber and the processing chamber in order to draw out ions in the plasma. The insulating spacer is fixed to each of the plurality of grids to determine a positional relationship of the grids and to prevent the grids from electrically coming into contact with each other. The insulating spacer has a grid support portion supporting one of the grids, and an annular groove in an insulating portion consisting of a grid fixing portion with an annular, substantially plane portion opposed to another of the grids with a predetermined space therebetween and formed in a region different from the grid support portion and a small diameter portion which is a cylindrical portion raised from a central portion of the annular, substantially plane portion and having an end surface abutting another of the grids, with the annular groove being perpendicular to the plane and separating a peripheral portion of the annular portion and the cylindrical portion from each other.

In the above-mentioned insulating spacer, it is preferable that: the grid fixing portion have a cylindrical accommodation hole at the central portion of the annular, substantially plane portion; and the small diameter portion, which is the cylindrical portion, be formed of a member different from the grid fixing portion and can be accommodated in the accommodation hole so as to protrude from the accommodation hole by a predetermined length, with the annular groove being formed between an outer peripheral portion of the cylindrical portion and an inner peripheral portion of the accommodation hole.

The above-mentioned grid support portion corresponds to the tapered surface of the grid fixing portion 21b of a first insulating member 22 described below or to the surface of the second insulating member 25 supporting the first grid 15. These support portions respectively abut the grids, and support them. Further, the above-mentioned annular, substantially plane portion corresponds to the surface 21f of the first insulating member 22 described below or to the surface 25c of the second insulating member 25, forming a part of the grid fixing portion described below. The annular, substantially plane portion is formed in a region of the grid fixing portion 21b different from the above-mentioned support portion. Further, the annular, substantially plane portion includes an annular groove as described below, or protrusions and recesses can exist in this portion, so that it will be described not as an exactly plane surface but as a substantially plane surface. Further, the cylindrical portion corresponds to the small diameter portion 21c or 25b, and one end surface of each of these cylindrical portions is connected to the annular, substantially plane portion side, and the other end surface thereof abuts the grid. Due to the presence of the cylindrical portion, the annular, substantially plane portion is opposed to the grid while maintaining a predetermined space therebetween.

According to the present invention, a groove portion is provided so as to surround the periphery of the cylindrical portion. As is known in the art, in an in-vacuum film forming process, such as sputtering, film formation in the interior of a groove is usually difficult to perform. In particular, in a process, such as ion milling, the surface processing is effected through sputtering of the surface of the workpiece, so that redeposition of the sputtering substance on the insulating spacer is conspicuous. By reducing the width of this groove portion mentioned above to a certain degree or more, and by increasing the depth thereof to a certain degree or more, it is possible to form a region where it is difficult for redeposition of a film, etc. on the insulating spacer to occur. Further, even in a case in which a reduction in the width of and an increase in the depth of the groove portion is restricted due to, for example, the limitation in the strength of the insulating spacer, the replacement frequency of the insulating spacer is substantially reduced as compared with that in the prior art due to the presence of the groove portion.

Further, according to the present invention, the annular groove is composed of two different members. Thus, even when a conductive film is deposited on the respective surfaces of these members, the insulation property of the insulating spacer is maintained as long as no conduction occurs between these members. Thus, as compared with the case in which a simple groove is formed, the length of time that the insulation property is maintained is further increased. Further, the first insulating member described below is a cylindrical member which has a length of approximately 10 mm and a radius of approximately 10 mm, so that it is rather difficult to actually form a narrow groove with a depth in this member. By forming the first insulating member by two members, the above-mentioned annular groove can be formed easily and reliably.

Further, in a case in which members of different potentials exist in a vacuum, when the insulation property of an insulator surface existing therebetween deteriorates due to adhesion of a film, etc., a so-called surface discharge may occur on the surface, which is a phenomenon in which discharge occurs on the surface to cause short-circuiting between the members. Due to the formation of the groove portion, however, the actual surface area of the insulating spacer is increased. As a result, the possibility of generation of a so-called surface discharge is reduced, thus making it possible to prevent short-circuiting due to such surface discharge.

The above and other objects of the present invention will appear more fully hereinafter from the consideration of the following description taken in connection with the accompanying drawings in which one example is illustrated by way of example.

DESCRIPTION OF THE PREFERRED EMBODIMENTS

Figure 1:
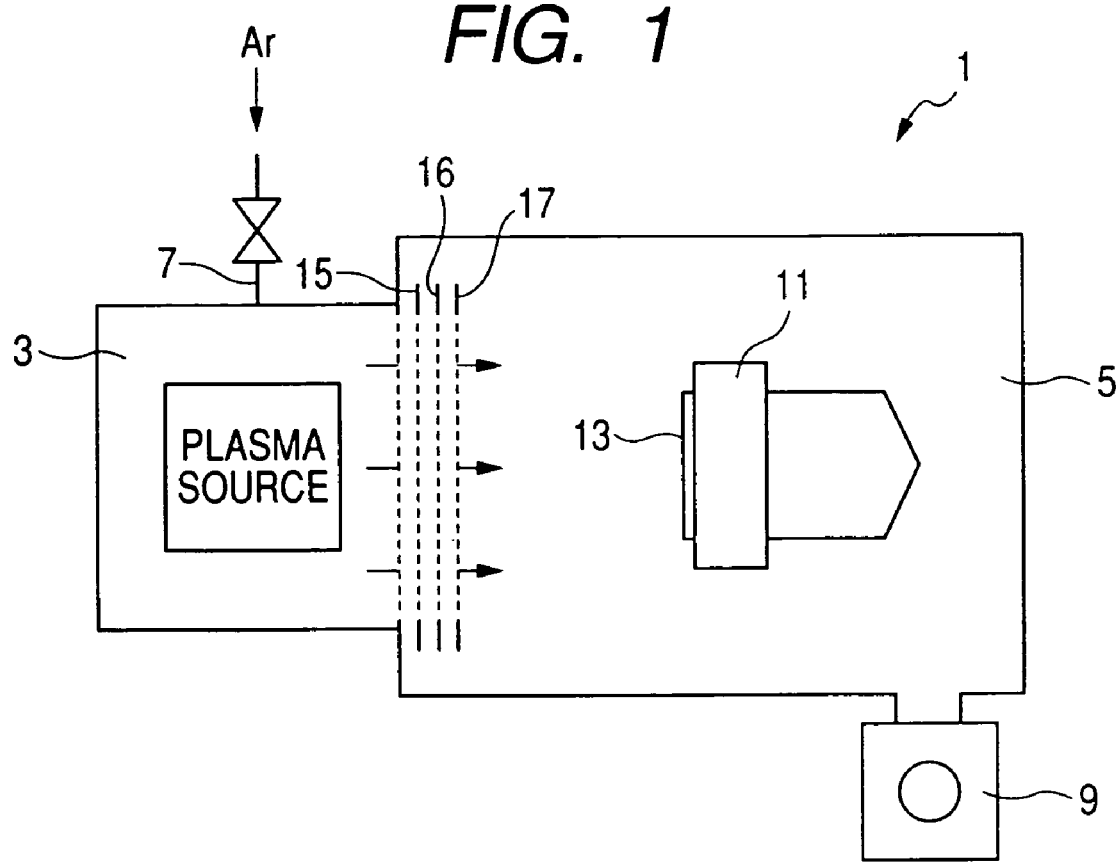
FIG. 1 is a diagram schematically showing the construction of an ion beam irradiation device according to an embodiment of the present invention.

An embodiment of the present invention will now be described with reference to the drawings. FIG. 1 is a diagram schematically showing the construction of an ion milling device 1 having as an ion source an ion beam irradiation device using an insulating spacer according to the present invention. In the drawings shown below, the components providing effects equivalent to those of the components of the above-described prior-art technology will be indicated by the same reference symbols. The device 1 is composed of two chambers: a plasma generation chamber 3; and a processing chamber 5. In this embodiment, argon gas, for example, is supplied to the plasma generation chamber 3 through a gas supply system 7 as the gas used for plasma generation. Examples of the plasma generation method that can be adopted are methods using constructions including the Kaufmann type, bucket type, IPC type, and ECR type. Although any one of those can be used for the plasma generation, a plasma is generated by an ICP type system in this embodiment, in which the possibility of impurity elements entering the ion beam is relatively low and in which the apparatus construction is simple. The processing chamber 5 is connected to an exhaust system 9, and a predetermined operation pressure is maintained in the interior of the plasma generation chamber 3 and of the processing chamber 5 by exhausting a gas, etc. existing therein through the exhaust system 9.

Figure 2:
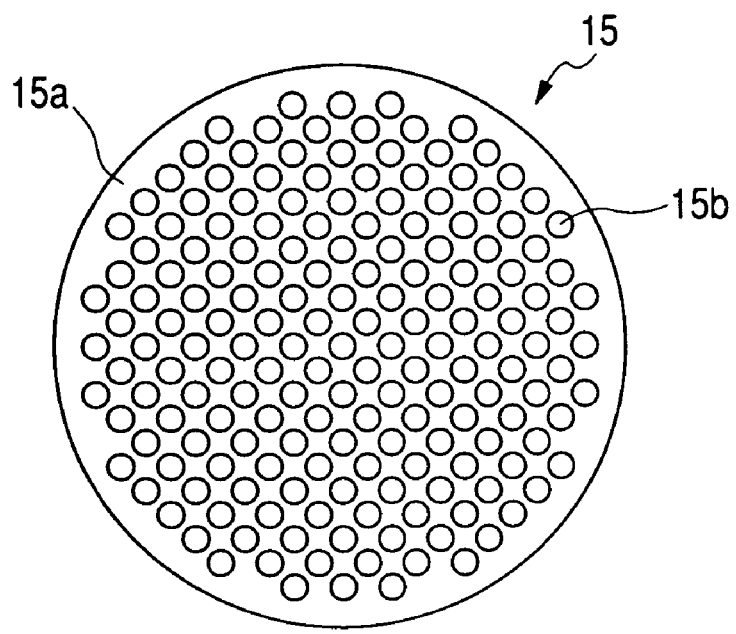
FIG. 2 is a front view of a grid of the ion milling device shown in FIG. 1.

Inside the processing chamber 5, there is arranged a holder 11 for supporting a workpiece 13. While in the drawing, the workpiece 13 is retained so as to face the plasma generating chamber 3, the direction of the holder 11 with respect to the plasma generation chamber 3 can be changed. Between the plasma generation chamber 3 and the processing chamber 5, there are arranged first, second, and third grids 15, 16, and 17 in that order from the plasma generation chamber 3 side. FIG. 2 is a front view of the first grid 15. The grid 15 is obtained by forming a plurality of small holes 15b in a disc-like member 15a. The second and third grids 16 and 17 have a similar structure. When the device is secured in position, these grids are arranged such that the small holes in the respective grids are aligned in the direction from the plasma generation chamber 3 toward the processing chamber 5.

A positive voltage is applied to the first and third grids 15 and 17, and is used as an acceleration voltage. A negative voltage is applied to the second grid 16, and is used as a deceleration voltage. The argon ions in the plasma generated in the plasma generation chamber 3 pass through the small holes formed in the grids, whereby they are applied to the surface of the workpiece 13 as an ion beam with a predetermined directivity. In a portion of the ion beam on the downstream side of the third grid 17, there is arranged a neutralizer (not shown) to neutralize the ion beam.

An insulating spacer according to an embodiment of the present invention is characterized in that it has, in a portion composed of an annular, substantially flat portion opposed to the grids and a cylindrical portion raised from a central portion of the annular, substantially plane portion and abutting the grids, an annular groove which is perpendicular to the plane and which separates the peripheral portion of the annular portion and the cylindrical portion from each other. In the following, the case in which this embodiment is applied to the insulating spacer 20 mentioned above as the prior-art technology is described. In this case, the insulating spacer 20 fixes the first through third grids 15, 16, and 17 at a predetermined interval, and the insulating spacer 20 is fixed between these grids. There is no particular difference in the basic construction of the insulating spacer 20 between this embodiment and the prior-art technology described above, so a description thereof will be omitted here.

Figure 3:
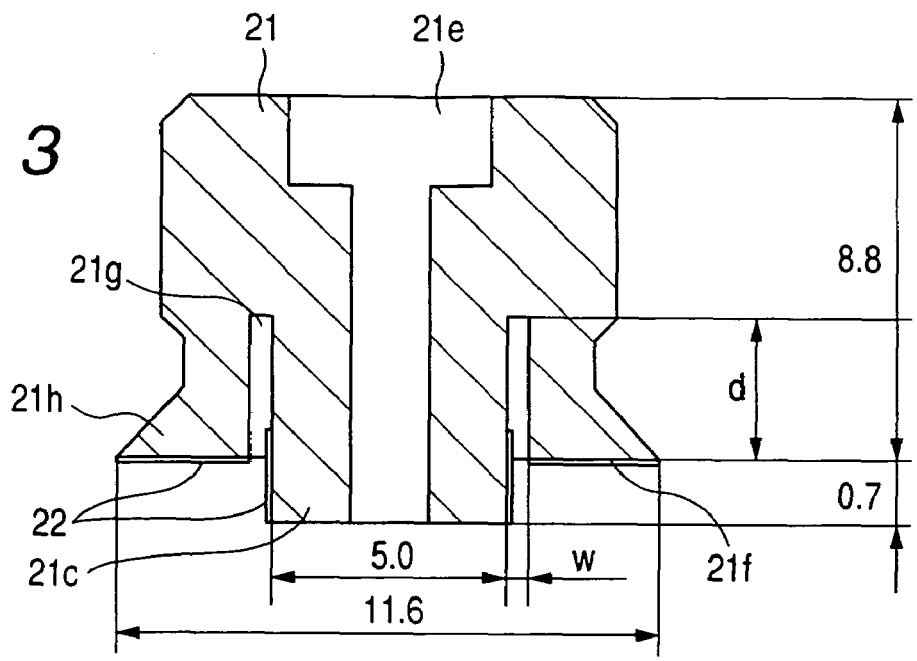
FIG. 3 is a schematic sectional view of a first insulating member according to an embodiment of the present invention.

In this embodiment, the annular, substantially flat surface corresponds to the surface 21$f$ of the first insulating member 21, and the cylindrical portion corresponds to the small diameter portion 21$c$. In the conventional construction, a conductive film is redeposited on the surface 21$f$ and the outer peripheral surface of the small diameter portion 21$c$, with the result that short-circuiting occurs between the grid 16 and the grid 17. In view of this, an annular groove 21$g$ perpendicular to the surface 21$f$ is formed in the periphery of the small diameter portion 21$c$ in the surface 21$f$. FIG. 3 is a sectional view, taken in the axial direction, of the first insulating member 21 with the annular groove 21$g$ formed therein. Due to the formation of the annular groove 21$g$, continuation of a redeposited film from the surface of the small diameter portion 21c to the surface 21f is prevented, thereby preventing a deterioration in insulation property due to redeposition of a conductive film.

Figure 4A:
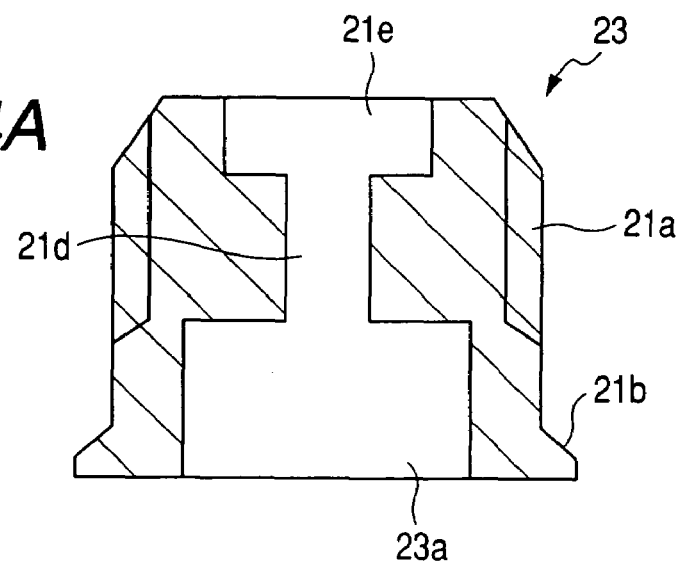
FIG. 4A is a diagram showing a separation example of an insulating member according to an embodiment of the present invention.
Figure 4B:
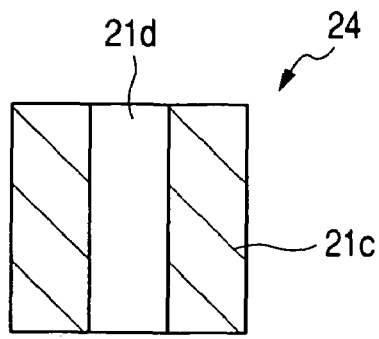
FIG. 4B is a diagram showing a separation example of an insulating member according to an embodiment of the present invention.
Figure 5:
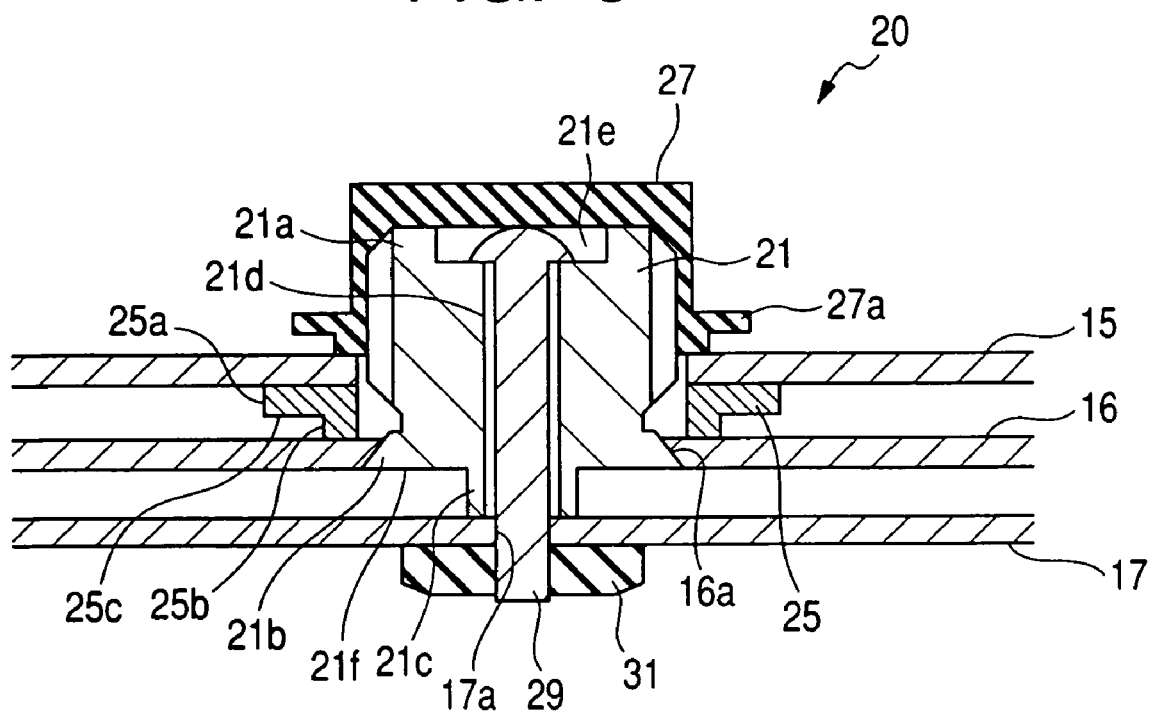
FIG. 5 is a schematic sectional view of a conventional insulating spacer in use.
Figure 6:
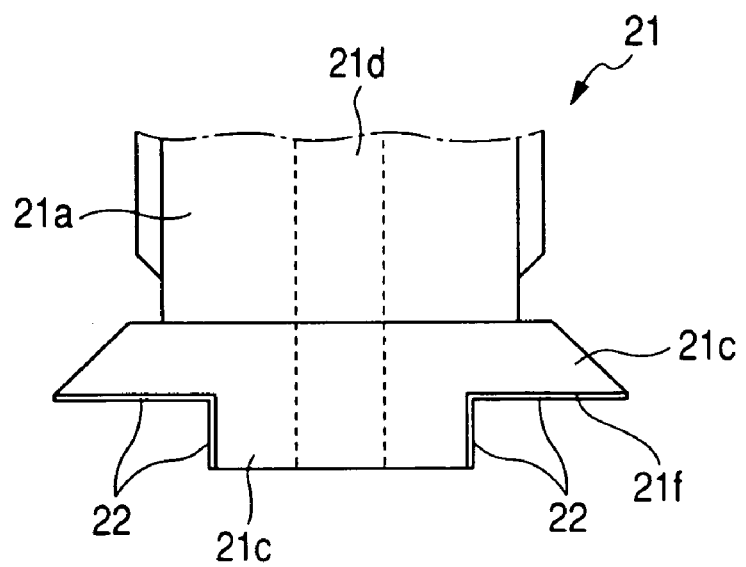
FIG. 6 is an enlarged partial view of the region of the insulating spacer shown in FIG. 5 where redeposition of a film matters.

It should be noted that when actually forming the annular groove 21g in the insulating member 21 formed of ceramic, it is rather-difficult to form a groove of a depth of to some degree or more due to limitations regarding processing and strength. In view of this, in still another embodiment, the first insulating member is composed of two members, as shown in FIGS. 4A and 4B, thereby making it possible to easily obtain the annular groove portion. These drawings are sectional views, taken along the axial direction, of the respective members. FIG. 4A shows a main body member 23 that corresponds to the large, diameter portion 21a and the grid fixing portion 21b of the first insulating member. Regarding the main body member 23, the portions corresponding to those of the first insulating member 21 are indicated by the same reference symbols as used in the description of the first insulating member. The main body member 23 has a depth large enough to partially accommodate a small diameter member 24 described below, and a cylindrical accommodation hole 23a having an inner diameter larger than the outer diameter of the small diameter member 24. The accommodation hole 23a is coaxial with a through-hole 21d, and is formed at an end on the opposite side of the enlarged-diameter portion 21e with respect to the through-hole 21d.

A part of the small diameter member 24 has a cylindrical configuration corresponding to the small diameter portion 21c, and has a through-hole 21d in the axial direction. The small diameter member 24 is inserted into the accommodation hole 23a such that the respective through-holes 21d are aligned with each other. The length of the small diameter member 24 and the depth of the accommodation hole 23a are set such that when the small diameter member 24 is inserted into the accommodation hole 23a, the length of the unaccommodated portion coincides with the length of the small diameter portion 21c. Further, the outer diameter of the small diameter member 24 is set such that the width of the gap formed between the outer peripheral surface of the small diameter member 24 and the inner peripheral surface of the accommodation hole 23a provides the above-mentioned annular groove. In this case, the depth of the accommodation hole 23a corresponds to the depth of the annular groove.

As described above, by dividing the first insulating member 21 into the main body member 23 and the small diameter member 24, it is possible to easily form an annular groove having a predetermined depth. Further, by forming the small diameter portion 21c and the grid fixing portion 21b of different members, the formation of a film continuous from the surface of the small diameter portion to the surface 21f becomes more difficult, whereby it is possible to maintain the insulation property of the insulating member surface for a longer period of time.

While in this embodiment the annular groove 21g is formed in the border portion between the grid fixing portion 21b and the small diameter portion 21c of the first insulating member 21, the formation position of the annular groove is not restricted to the border portion. More specifically, the annular groove 21g may be formed at any portion as long as it is in the surface 21f facing the grid 17 and surrounds the periphery of the small diameter portion 21c. When the first insulating member 21 is divided into the main body member 23 and the small diameter member 24, it is also possible for the small diameter member to be formed as a stepped cylinder with portions of different outer diameters instead of being simply formed as a cylinder.

Further, it is also possible to provide the second insulating member 25 with an annular groove with a depth in the axial direction like that formed in the first insulating member 21. In this case, the annular groove is configured so as to surround the small diameter portion 25b of the second insulating member and is formed in the portion of the surface 25c of the large diameter portion 25a facing the grid 16 so as to have a depth in the thickness direction thereof. Due to the formation of such an annular groove, it is possible to maintain the insulation property of the insulating member for a long period of time, and to substantially reduce the maintenance frequency for the milling device, etc.

In the following, the insulation property maintaining time when the groove portion of the present invention is actually formed in the insulating spacer of the above-described embodiment, will be described. FIG. 3 shows the various dimensions of the first insulating member. In the first insulating member, the maximum outer diameter of the grid fixing portion 21b is 11.6 mm, the outer diameter of the small diameter portion 21c is 5.0 mm, the sum total of the lengths of the large diameter portion 21a and the grid fixing portion 21b is 8.8 mm, and the length of the small diameter portion 21c is 0.7 mm. In the first insulating member 21 having the above dimensions, an annular groove with a width w and a depth d was formed, and the length of time that the insulation property is maintained in the actual operation was obtained by varying the above values.

Table 1 shows the results obtained.

TABLE 1

| w (mm) | 0 | 0.5 | 0.75 | 0.75 | 0.75 (separated) |
|---|---|---|---|---|---|
| d (mm) | 0 | 1.0 | 1.0 | 2.0 | 2.0 (separated) |
| Maintaining time (hr) | 100 | 150 | 200 | 800 | 800 + α |

As is apparent from Table 1, the effect of the present invention is to be observed with a groove width of 0.5 mm or more, and it has been confirmed that, with a groove depth of 2.0 mm, it is possible to substantially extend the length of time that the insulation property can be maintained. Further, it has been confirmed that, by dividing the first insulating member into a main body member and a small diameter member, it is possible to further extend the length of time that the insulation property can be maintained.

In the embodiment mode and embodiment described above, the present invention is applied to an ion milling device. However, this should not be construed restrictively; examples of a device to which the present invention would be applicable include various devices using a vacuum, such as an ion implantation device, an ion beam evaporation device, an ion beam sputtering device, and a CVD device. Further, while in the above embodiment the workpiece consists of an alumina film, the present invention can be utilized to process various films, such as a ceramic film, a metal film, and an organic film.

As many apparently widely different embodiments of the present invention can be made without departing from the sprit and scope thereof, it is to be understood that the invention is not limited to the specific embodiments thereof except as defined in the appended claims.

This application claims priority from Japanese Patent Application No. 2004-262327 filed on Sep. 9, 2004, which is hereby incorporated by reference herein.

What is claimed is:

1. An ion beam irradiation device comprising a plasma generation chamber which generates a plasma inside, and a processing chamber connected to the plasma generation chamber, with a plurality of grids with a large number of small holes being arranged between the plasma generation chamber and the processing chamber in order to draw out ions in the plasma, the ion beam irradiation device further comprising an insulating spacer fixed to each of the plurality of grids to determine a positional relationship of the grids and to prevent the grids from electrically coming into contact with each other, wherein the insulating spacer has a grid support portion supporting one of the grids, and an annular groove in an insulating portion consisting of a grid fixing portion with an annular, substantially plane portion opposed to another of the grids with a predetermined space therebetween and formed in a region different from the grid support portion and a small diameter portion which is a cylindrical portion being raised from a central portion of the annular, substantially plane portion and having an end surface abutting another of the grids, with the annular groove being perpendicular to the plane and separating a peripheral portion of the annular portion and the cylindrical portion from each other.

2. An ion beam irradiation device according to claim 1, wherein the grid fixing portion has a cylindrical accommodation hole at the central portion of the annular, substantially plane portion, and wherein the small diameter portion, which is the cylindrical portion, is formed of a member different from the grid fixing portion and can be accommodated in the accommodation hole to protrude from the accommodation hole by a predetermined length, with the annular groove being formed between an outer peripheral portion of the cylindrical portion and an inner peripheral portion of the accommodation hole.

3. An ion milling device comprising: an ion beam irradiation device as claimed in claim 1, a processing chamber into which ions drawn out of the ion beam irradiation device is introduced, and a holder arranged in the processing chamber for holding a workpiece at a position where the ions drawn out are applied.

4. An ion milling device comprising: an ion beam irradiation device as claimed in claim 2, a processing chamber into which ions drawn out of the ion beam irradiation device is introduced, and a holder arranged in the processing chamber for holding a workpiece at a position where the ions drawn out are applied.

5. An insulating spacer which is used in an ion beam irradiation device comprising a plasma generation chamber which generates a plasma inside, and a processing chamber connected to the plasma generation chamber, with a plurality of grids with a large number of small holes being arranged between the plasma generation chamber and the processing chamber in order to draw out ions in the plasma, the insulating spacer being fixed to each of the plurality of grids to determine a positional relationship of the grids and to prevent the grids from electrically coming into contact with each other, wherein the insulating spacer has a grid support portion supporting one of the grids, and an annular groove in an insulating portion consisting of a grid fixing portion with an annular, substantially plane portion opposed to another of the grids with a predetermined space therebetween and formed in a region different from the grid support portion and a small diameter portion which is a cylindrical portion being raised from a central portion of the annular, substantially plane portion and having an end surface abutting another of the grids, with the annular groove being perpendicular to the plane and separating a peripheral portion of the annular portion and the cylindrical portion from each other.

6. An insulating spacer according to claim 5, wherein the grid fixing portion has a cylindrical accommodation hole at the central portion of the annular, substantially plane portion, and wherein the small diameter portion, which is the cylindrical portion, is formed of a member different from the grid fixing portion and can be accommodated in the accommodation hole to protrude from the accommodation hole by a predetermined length, with the annular groove being formed between an outer peripheral portion of the cylindrical portion and an inner peripheral portion of the accommodation hole.

* * * * *

UNITED STATES PATENT AND TRADEMARK OFFICE
CERTIFICATE OF CORRECTION

PATENT NO. : 7,371,991 B2 Page 1 of 1
APPLICATION NO. : 11/205073
DATED : May 13, 2008
INVENTOR(S) : Takeuchi et al.

It is certified that error appears in the above-identified patent and that said Letters Patent is hereby corrected as shown below:

On the title page, Item (54), and Column 1, lines 1-2, the title is incorrect. Item (54) and Column 1, lines 1-2, should read as follows:

Item --(54) ION BEAM IRRADIATION DEVICE AND INSULATING SPACER FOR THE DEVICE--

Signed and Sealed this

Twenty-ninth Day of July, 2008

JON W. DUDAS
*Director of the United States Patent and Trademark Office*